(12) United States Patent
Goto

(10) Patent No.: US 10,068,941 B2
(45) Date of Patent: Sep. 4, 2018

(54) IMAGE PICKUP DEVICE AND METHOD FOR MANUFACTURING THE SAME

(71) Applicant: Renesas Electronics Corporation, Koutou-ku, Tokyo (JP)

(72) Inventor: Yotaro Goto, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/648,362

(22) Filed: Jul. 12, 2017

(65) Prior Publication Data

US 2017/0309668 A1    Oct. 26, 2017

Related U.S. Application Data

(62) Division of application No. 15/017,573, filed on Feb. 5, 2016, now Pat. No. 9,773,830.

(30) Foreign Application Priority Data

Feb. 6, 2015 (JP) .................. 2015-021925

(51) Int. Cl.
*H01L 27/146* (2006.01)

(52) U.S. Cl.
CPC .... *H01L 27/14636* (2013.01); *H01L 27/1463* (2013.01); *H01L 27/14609* (2013.01); *H01L 27/14683* (2013.01)

(58) Field of Classification Search
CPC ......... H01L 27/14636; H01L 27/14605; H01L 27/1463; H01L 27/14603; H01L 27/14698
See application file for complete search history.

(56) References Cited

U.S. PATENT DOCUMENTS

| 7,598,581 | B2  | 10/2009 | Lee et al. |
| 9,773,830 | B2* | 9/2017  | Goto ................ H01L 27/14609 |
| 2004/0000669 | A1 | 1/2004 | Yamamura |
| 2009/0108389 | A1 | 4/2009 | Inoue |
| 2010/0301444 | A1 | 12/2010 | Koike |
| 2011/0149137 | A1* | 6/2011 | Koike ............... H01L 27/14603 348/308 |
| 2012/0112253 | A1 | 5/2012 | Koike |
| 2015/0061060 | A1* | 3/2015 | Suzuki ............. H01L 27/14636 257/431 |

FOREIGN PATENT DOCUMENTS

| EP | 2747139 A1 | 6/2014 |
| JP | 2003-324189 A | 11/2003 |
| JP | 2008-199059 A | 8/2008 |
| JP | 2009-099626 A | 5/2009 |
| JP | 2009-302565 A | 12/2009 |
| JP | 2010-278232 A | 12/2010 |
| JP | 2012-104654 A | 5/2012 |

OTHER PUBLICATIONS

Extended European Search Report, dated Jun. 28, 2016, in European Patent Application No. 16154437.4.

* cited by examiner

*Primary Examiner* — Stephen Bradley
(74) *Attorney, Agent, or Firm* — Shapiro, Gabor and Rosenberger, PLLC

(57) ABSTRACT

An insulating liner layer has an extra-pixel removal region located outside a pixel region in a region of a vertical angle of at least one of four corners of the pixel region and having the insulating liner layer removed therefrom.

3 Claims, 17 Drawing Sheets

IMAGE PICKUP DEVICE AND METHOD FOR MANUFACTURING THE SAME

This nonprovisional application is based on Japanese Patent Application No. 2015-021925 filed on Feb. 6, 2015, with the Japan Patent Office, the entire contents of which are hereby incorporated by reference.

BACKGROUND OF THE INVENTION

Field of the Invention

The present invention relates to an image pickup device and a method for manufacturing the same.

Description of the Background Art

Image pickup devices are generally classified into a charge coupled device (CCD) and a complementary metal oxide semiconductor (CMOS) image sensor. In recent years, CMOS image sensors are produced using copper (Cu) as a material for an interconnect. In order to prevent the copper from diffusing from the copper interconnect, a liner film (SiN, SiCN, etc.) is deposited on the copper interconnect as an anti-diffusion film. A technique using such a liner film is described for example in Japanese Patent Laying-Open No. 2009-302565 etc.

A process for processing a semiconductor device includes a heat treatment referred to as a sintering process, in which for example a dangling bond generated in a gate oxide film is terminated by hydrogen. When a liner film is deposited, as described in Japanese Patent Laying-Open No. 2009-302565, the liner film does not let hydrogen pass therethrough easily, and the dangling bond cannot be terminated sufficiently. This prevents an interface state density from recovering, and at a dark period, in particular, a dark current flows, resulting in degraded dark characteristics. The degradation of the dark characteristics is significant at the four corners of a pixel sensor area as seen in a plan view, in particular.

In order to improve the above dark characteristics, the liner film has a region removed by techniques described for example in Japanese Patent Laying-Open Nos. 2010-278232, 2012-104654, etc.

Japanese Patent Laying-Open No. 2010-278232 describes removing a liner film other than that on a copper interconnect of a pixel region and that of a circuit formation region. The publication describes that this allows the pixel region and any other region to have hydrogen introduced into a substrate in uniform amounts, respectively, and thus have their semiconductor devices with their characteristics matched.

Furthermore, Japanese Patent Laying-Open No. 2012-104654 describes providing a dummy pixel region with a dummy via interconnect penetrating a liner film. The publication describes that the dummy via allows hydrogen to diffuse therethrough to thus suppress a difference otherwise caused between a pixel region and the dummy pixel region in their dark characteristics.

SUMMARY OF THE INVENTION

In Japanese Patent Laying-Open No. 2010-278232, however, the liner film other than that on the copper interconnect is removed, which facilitates diffusion of copper from the copper interconnect. Furthermore, when the copper interconnect is formed, chemical mechanical polishing (CMP) is performed using a slurry, which contains potassium hydroxide as a major component, and hence contains potassium (K), which also easily diffuses. When the copper and the potassium diffuse to a transistor, a small leakage current is caused, and the transistor is thus prone to erroneously operate.

Japanese Patent Laying-Open No. 2012-104654 describes that the dummy pixel region is provided with the dummy via interconnect penetrating the liner film, however, the publication does not provide any study for a positional relationship of the dummy via interconnect with the pixel region. Accordingly, the degradation of the dark characteristics at the four corners of the pixel sensor area as seen in a plan view, as aforementioned, cannot be prevented.

Other issues to be addressed and novel features will be apparent from the present specification and the accompanying drawings.

According to one embodiment, an insulating liner layer has an extra-pixel removal region in a region that is located outside a pixel region and is a region of a vertical angle of at least one of four corners of the pixel region, and has the insulating liner layer removed therefrom.

According to the above one embodiment, an image pickup device that can suppress degradation of dark characteristics at the four corners of a pixel sensor area and can suppress an erroneous operation of a transistor, and a method for manufacturing the same, can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter reference will be made to the drawings to describe the present embodiment.

Initially reference will be made to FIGS. 1 and 2 to describe each region disposed on a main surface of a semiconductor substrate in an image pickup device of the present embodiment.

Figure 1:
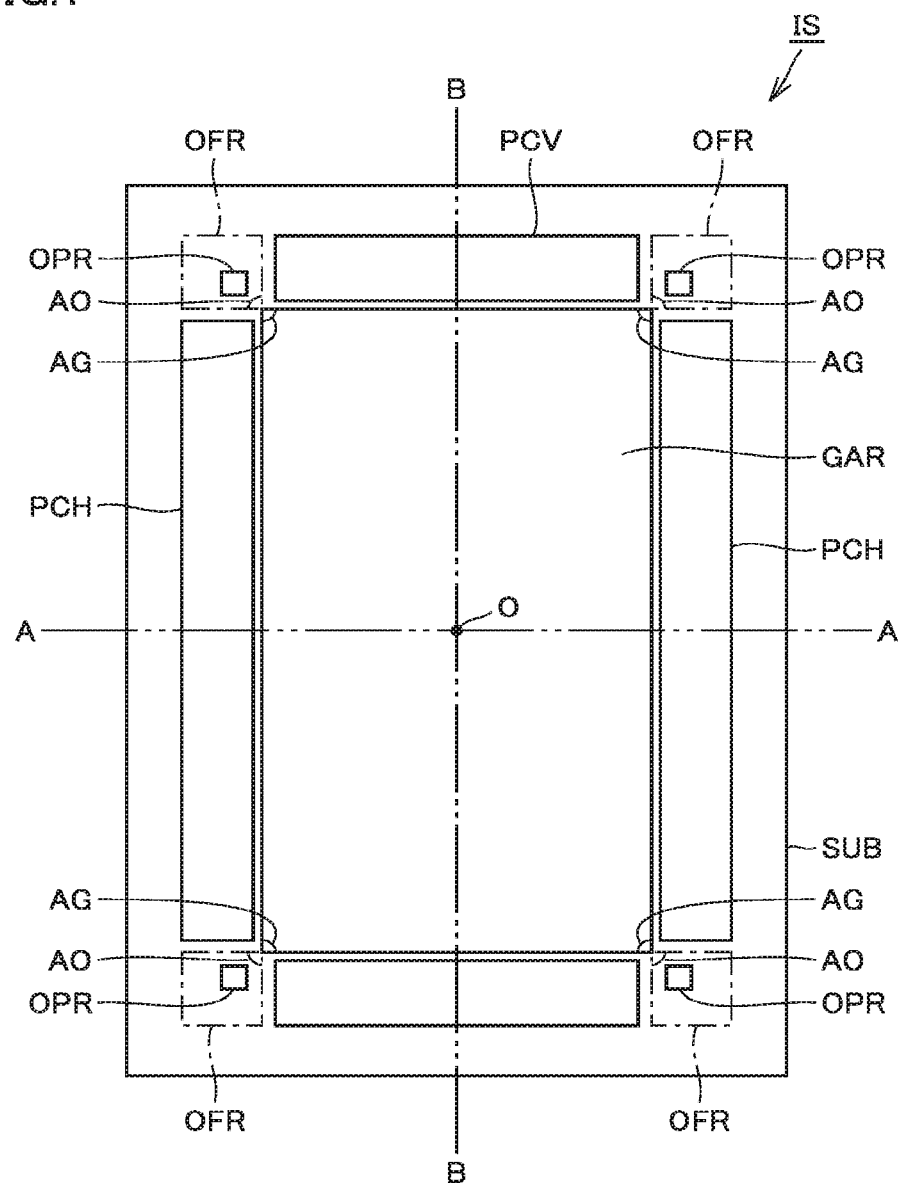
FIG. 1 is a plan view schematically showing a configuration of an image pickup device according to one embodiment.

As shown in FIG. 1, while the present embodiment provides an image pickup device IS for example in a state of a chip, image pickup device IS may be in a form of a wafer or may be sealed with resin and thus packaged. Image pickup device IS in the present embodiment mainly has a pixel region GAR, peripheral circuit regions PCH, PCV, and a removal provision region OFR on a surface of a semiconductor substrate SUB, for example.

Pixel region GAR has a rectangular geometry on the main surface of semiconductor substrate SUB. Herein, having a "rectangular geometry on the main surface" means having the rectangular geometry as seen in a direction orthogonal to the main surface of semiconductor substrate SUB (i.e., in a plan view). Pixel region GAR has a plurality of pixels formed therein.

Peripheral circuit regions PCH, PCV are regions external to pixel region GAR, and are disposed at a perimeter of pixel region GAR. Peripheral circuit regions PCH, PCV are each disposed along a side of the contour of rectangular pixel region GAR. Peripheral circuit region PCH includes an analog digital circuit (ADC) for example. Furthermore, peripheral circuit region PCV includes a vertical scanning circuit (VSCAN) for example.

Removal provision region OFR is disposed in a region of a vertical angle of each of four corners AGs of rectangular pixel region GAR, as seen in a plan view. The region of the vertical angle of corner AG is a region having a corner AO having a relationship of a vertical angle with corner AG in a plan view. In other words, the region of the vertical angle of corner AG is a region sandwiched by two imaginary straight lines prolonged outwardly of rectangular pixel region GAR from its two sides configuring corner AG of rectangular pixel region GAR in a plan view.

Figure 2:
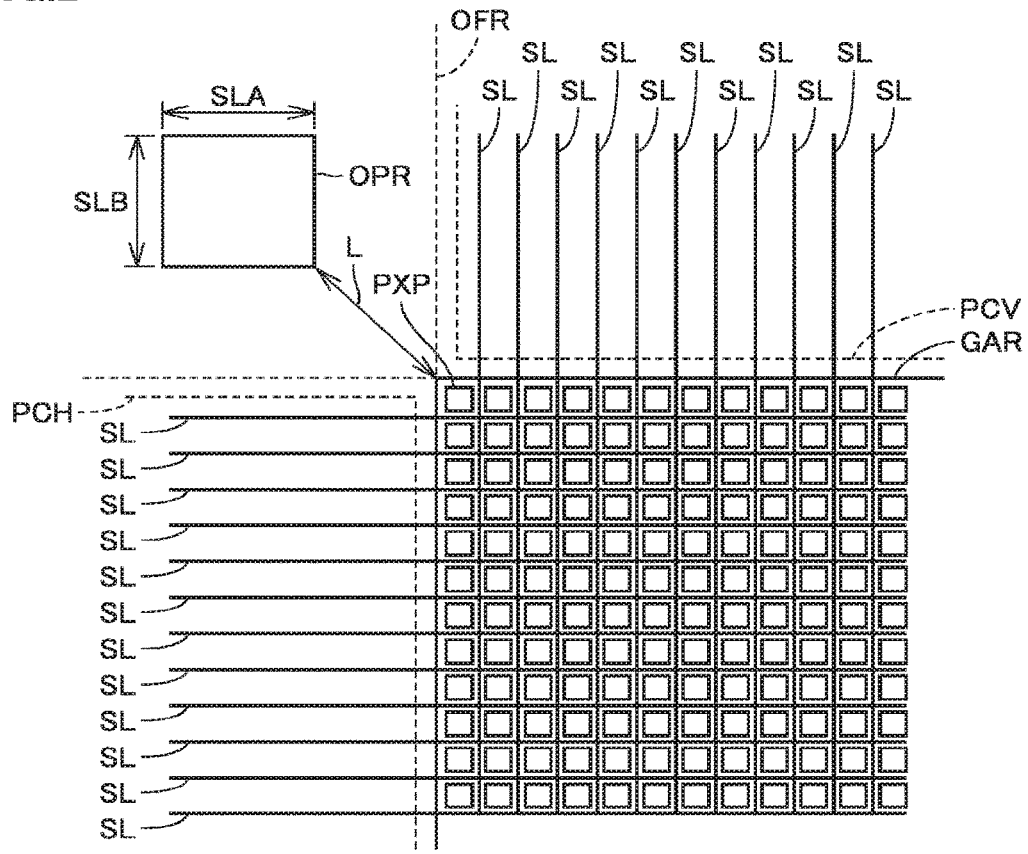
FIG. 2 is a schematic plan view enlarging a portion of the image pickup device shown in FIG. 1.

As shown in FIG. 2, pixel region GAR has a plurality of pixels (or photoelectric conversion devices) PXPs disposed in rows and columns. The plurality of pixels PXPs each have a signal line (or control line) SL electrically connected thereto. The plurality of signal lines SLs include a signal line extending along a row and a signal line extending along a column. These signal lines SLs linearly extend externally from the inside of rectangular pixel region GAR, and reach each of peripheral circuit regions PCH, PCV.

Removal provision region OFR is disposed in a region free of these signal lines SLs (i.e., in the region of the vertical angle of corner AG). Removal provision region OFR has an extra-pixel removal region OPR formed therein. Extra-pixel removal region OPR is a region having insulating liner layers LL1-LL4 (FIG. 5) removed therefrom and an opening thus formed therein.

Extra-pixel removal region OPR is a region outside pixel region GAR, and is disposed inside a region of a vertical angle of at least one of four corners AGs of pixel region GAR (i.e., removal provision region OFR).

Extra-pixel removal region OPR is located within a range allowing rectangular pixel region GAR to have a corner having a distance L to extra-pixel removal region OPR within 1000 μm in a plan view. Herein distance L is the shortest distance between the corner of pixel region GAR and extra-pixel removal region OPR. Extra-pixel removal region OPR has a rectangular, planar geometry having side lengths SLA, SLB of 30 μm or more and 200 μm or less in a plan view.

Figure 3:
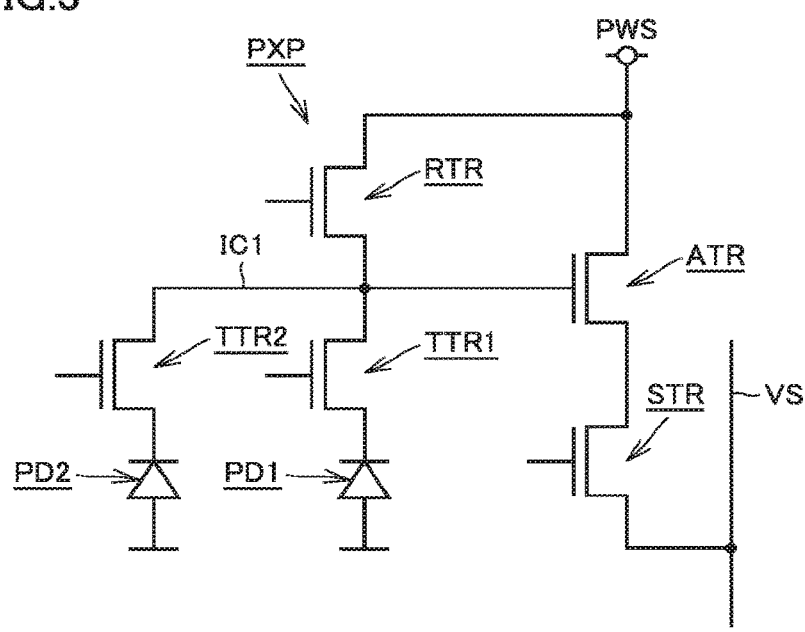
FIG. 3 is a circuit diagram showing a circuit configuration of a single pixel in the image pickup device shown in FIG. 1.
Figure 4:
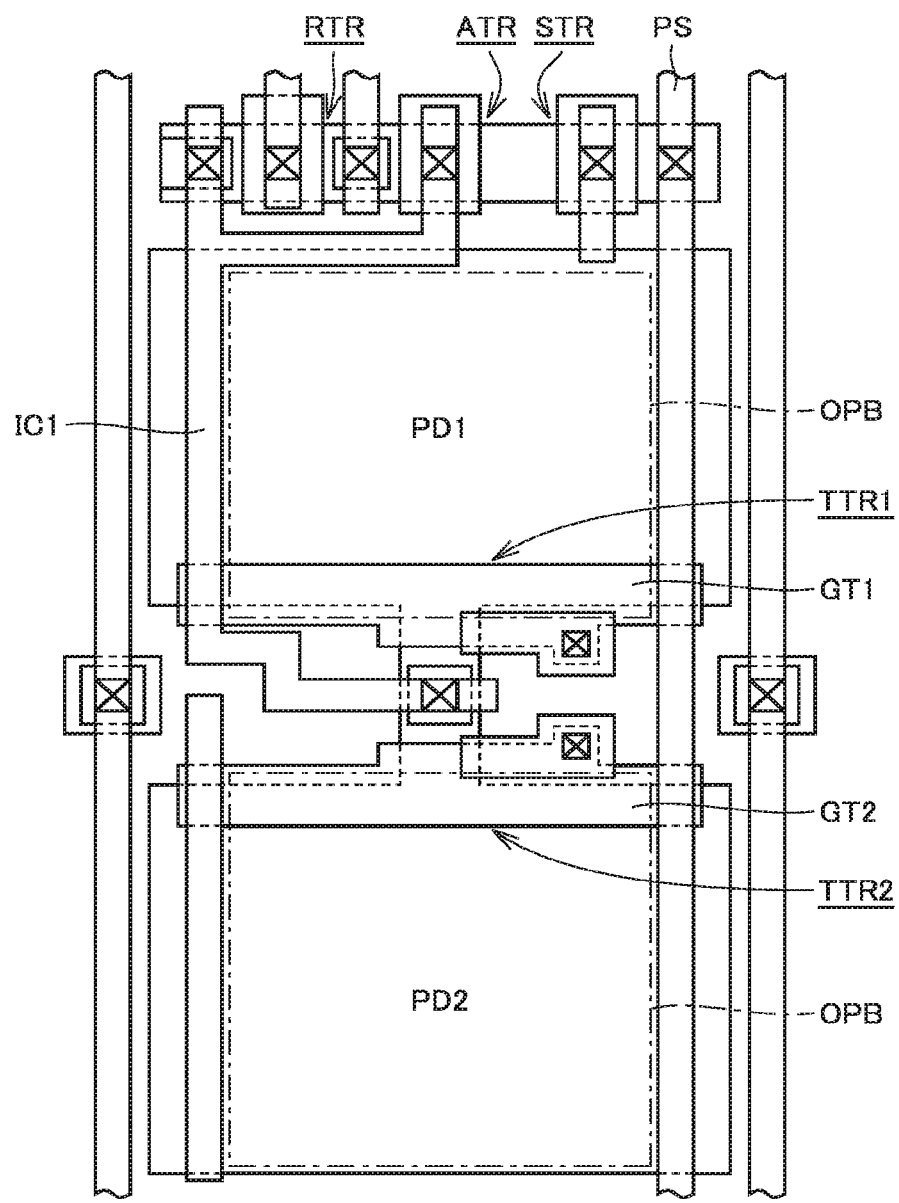
FIG. 4 is a schematic plan view enlarging and showing a configuration of a portion inside a pixel region in the image pickup device shown in FIG. 1.

Reference will now be made to FIGS. 3 and 4 to describe a circuit configuration of each of the plurality of pixels (or photoelectric conversion devices) disposed in pixel region GAR.

As shown in FIG. 3 and FIG. 4, the plurality of pixels PXPs each mainly have photodiodes (or photoelectric conversion units) PD1 and PD2, transferring transistors TTR1 and TTR2, a resetting transistor RTR, an amplifying transistor ATR, and a selecting transistor STR.

Figure 5:
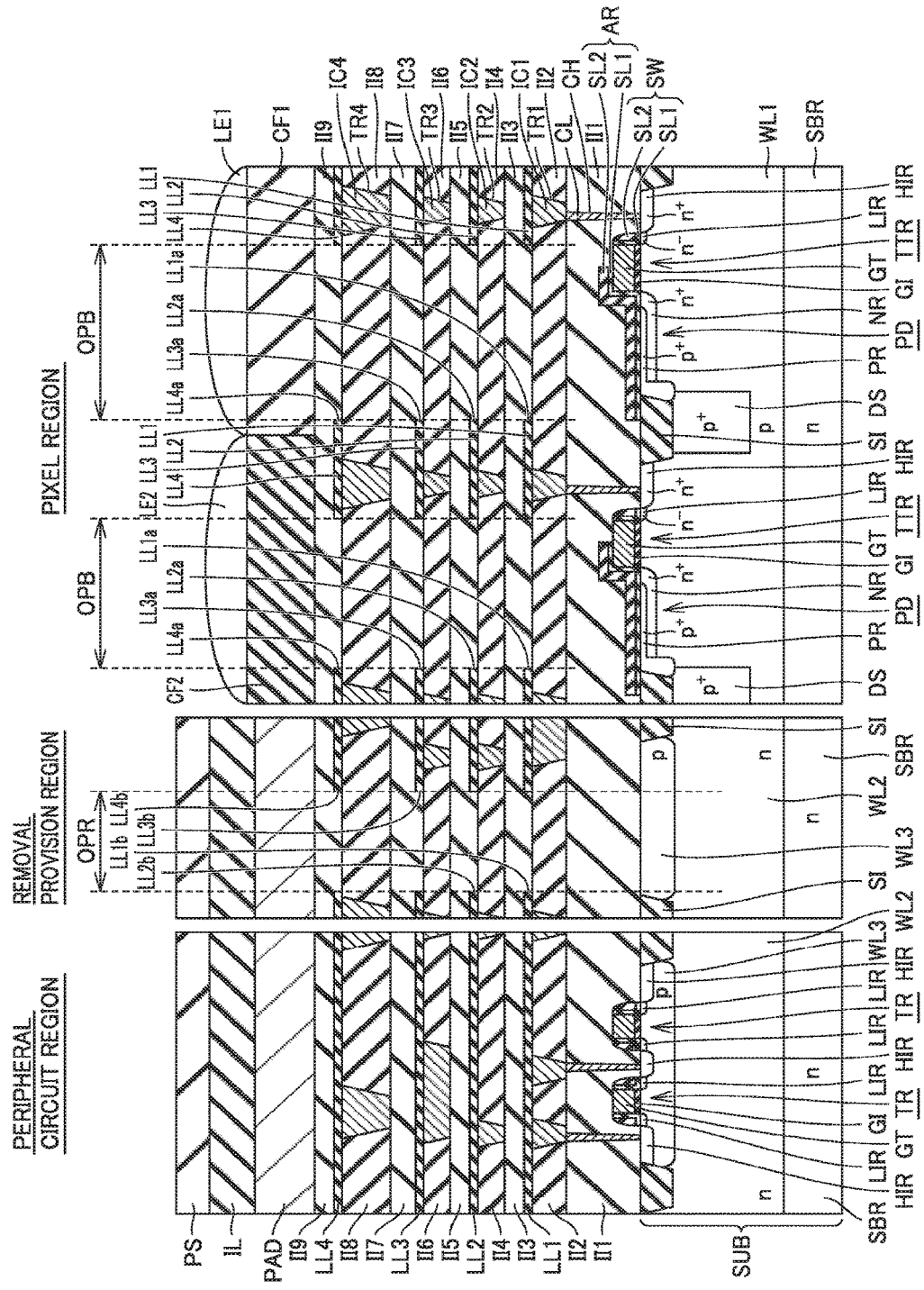
FIG. 5 is a cross section schematically showing a configuration of a pixel region, a removal provision region, and a peripheral circuit region in the image pickup device shown in FIG. 1.

Photodiodes PD1 and PD2 are each a photoelectric conversion unit and have a p type region and an n type region mutually configuring a pn junction. Photodiodes PD1, PD2 receive light at a side, which is provided with an anti-reflection film AR (FIG. 5). Preferably, anti-reflection film AR structurally varies (in thickness, quality, and the like) depending on the color of the light to be imaged.

Transferring transistors TTR1, TTR2, resetting transistor RTR, amplifying transistor ATR, and selecting transistor STR are each an insulated gate field effect transistor, and it is for example an n channel metal oxide semiconductor (MOS) transistor. Each of these transistors has a pair of n type source/drain regions formed in a surface of semiconductor substrate SUB, and a gate electrode layer formed on a region of the semiconductor substrate between the paired source/drain regions with a gate insulating layer (of silicon oxide film) interposed. Furthermore, each gate electrode layer has a sidewall covered with a sidewall (a side wall insulating film (not shown)).

Photodiodes PD1, PD2 each have a p type region connected for example to a ground potential. Photodiode PD1 and transferring transistor TTR1 have an n type region and an n type source region, respectively, electrically connected to each other, and formed for example of a common n type region. Photodiode PD2 and transferring transistor TTR2 have an n type region and an n type source region, respectively, electrically connected to each other, and formed for example of a common n type region.

Transferring transistors TTR1 and TTR2 have their respective n type drain regions electrically connected to each other, and formed for example of a common n type region. Transferring transistors TTR1 and TTR2 have their respective n type drain regions each electrically connected for example via an interconnect layer IC1 to resetting transistor RTR at an n type source region.

Resetting transistor RTR and amplifying transistor ATR have an n type drain region and an n type source region, respectively, electrically connected to each other, and formed for example of a common n type region. Resetting transistor RTR and amplifying transistor ATR have the n type drain region and the n type source region, respectively, with a power supply line PWS electrically connected thereto.

Amplifying transistor ATR has a gate electrode layer electrically connected via interconnect layer IC1 to transferring transistor TTR1 at the n type drain region, transferring transistor TTR2 at the n type drain region, and resetting transistor RTR at the n type source region.

Amplifying transistor ATR and selecting transistor STR have an n type drain region and an n type source region, respectively, electrically connected to each other, and formed for example of a common n type region. Selecting transistor STR has an n type drain region electrically connected to a vertical signal line VS.

Reference will now be made to FIG. 5 to describe a cross-sectional configuration of each of pixel region GAR, peripheral circuit regions PCH, PCV, and removal provision region OFR of the image pickup device in the present embodiment.

As shown in FIG. 5, pixel region GAR has formed therein a p type well region WL1 in semiconductor substrate SUB for example of silicon on an n type region SBR. Photodiode PD, transferring transistor TTR, etc. are formed at a surface of p type well region WL1 (or a main surface of semiconductor substrate SUB).

Note that, in FIG. 5, for the sake of illustration, devices such as transistors other than photodiode PD and transferring transistor TTR are not shown. Photodiode PD shown in FIG. 5 corresponds to any one of photodiode PD1 or PD2 shown in FIG. 3 and FIG. 4. Transferring transistor TTR shown in FIG. 5 corresponds to any one of transferring transistor TTR1 or TTR2 shown in FIG. 3 and FIG. 4.

As shown in FIG. 5, photodiode PD has a $p^+$ region PR and an $n^+$ region NR. $P^+$ region PR is formed in pixel region GAR at the main surface of semiconductor substrate SUB. $N^+$ region NR covers a lower side of $p^+$ region PR, and configures a pn junction with $p^+$ region PR.

Photodiode PD is covered with anti-reflection film AR provided on the main surface of semiconductor substrate SUB. Anti-reflection film AR is made for example of a silicon oxide film SL1 and a silicon nitride film SL2 stacked in layers. Silicon oxide film SL1 is formed in contact with the main surface of semiconductor substrate SUB. Silicon nitride film SL2 is formed on silicon oxide film SL1.

Transferring transistor TTR has an n type source region NR, an n type drain region LIR, HIR, a gate insulating layer GI, and a gate electrode layer GT. N type source region NR is formed in the main surface of semiconductor substrate SUB, and shares n type region in common with n type region NR of photodiode PD.

N type drain region LIR, HIR is spaced from n type source region NR, and is formed in the main surface of semiconductor substrate SUB. N type drain region LIR, HIR has a lightly doped drain (LDD) structure, and has an $n^-$ region LIR and an $n^+$ region HIR. N region LIR and $n^+$ region HIR are both formed in the main surface of semiconductor substrate SUB. $N^-$ region LIR is in contact with $n^+$ region HIR at a side closer to n type region NR.

Gate electrode layer GT is formed on the main surface of semiconductor substrate SUB between n type source region NR and n type drain region LIR, HIR with gate insulating layer GI interposed. Anti-reflection film AR may have one end running up onto gate electrode layer GT to also serve as a sidewall insulating layer for gate electrode layer GT.

Furthermore, a sidewall insulating layer SW is formed on a side wall of gate electrode layer GT opposite to anti-reflection film AR. As well as anti-reflection film AR, sidewall insulating layer SW is made for example of silicon oxide film SL1 and silicon nitride film SL2 stacked in layers.

In the main surface of semiconductor substrate SUB, an element isolating insulating layer SI is provided for example in the form of shallow trench isolation (STI). Under element isolating insulating layer SI, a $p^+$ region DS is formed as an element isolating region.

Peripheral circuit region PCH, PCV has formed therein an n type well region WL2 in semiconductor substrate SUB on n type region SBR. In a surface of n type well region WL2 (i.e., the main surface of semiconductor substrate SUB), a p type well region WL3 is formed. At a surface of p type well region WL3 (or the main surface of semiconductor substrate SUB), transistor TR for the peripheral circuit and the like are formed.

Transistor TR for the peripheral circuit has a pair of n type source/drain regions LIR, HIR, gate insulating layer GI, and gate electrode layer GT. The paired n type source/drain regions LIR, HIR are mutually spaced and thus formed in the main surface of semiconductor substrate SUB. The paired n type source/drain regions LIR, HIR each have an LDD structure, and have $n^-$ region LIR and $n^+$ region HIR. Gate electrode layer GT is formed on the main surface of semiconductor substrate SUB between the paired n type source/drain regions LIR, HIR with gate insulating layer GI interposed.

In removal provision region OFR, n type well region WL2 is formed in semiconductor substrate SUB on n type region SBR. Removal provision region OFR does not have any device formed on the main surface of semiconductor substrate SUB. Therefore, only p type well region WL3 is formed in the main surface of semiconductor substrate SUB within n type well region WL2. Furthermore, p type well region WL3 may be dispensed with. In that case, n type well region WL2 may be located in the main surface of semiconductor substrate SUB.

Pixel region GAR, peripheral circuit region PCH, PCV, and removal provision region OFR each have an interlayer insulating layer II1 formed therein to cover the main surface of semiconductor substrate SUB. Interlayer insulating layer II1 is made for example of silicon oxide film. Interlayer insulating layer II1 has a plurality of contact holes CHs formed therein to reach each transistor's source/drain regions, gate electrode layer, etc. A buried conducting layer CL is buried in each contact hole CH.

On a surface of interlayer insulating layer II1, an interlayer insulating layer II2 is formed. Interlayer insulating layer II2 is made for example of silicon oxide film. Interlayer insulating layer II2 has an interconnecting trench TR1 formed therein. In interconnecting trench TR1, an interconnect layer IC1 is formed. Interconnect layer IC1 is made of material containing copper, and it is made of material such as for example copper (Cu) and copper aluminum (CuAl).

Interconnect layer IC1 is covered with an insulating liner layer LL1 formed on interlayer insulating layer II2. Insulating liner layer LL1 is for preventing diffusion of copper contained in interconnect layer IC1. Insulating liner layer LL1 is made of material containing nitrogen, and it is made of material such as for example silicon nitride (SiN) and silicon carbonitride (SiCN).

Insulating liner layer LL1 has openings LL1a, LL1b formed therein. Opening LL1a is a portion located in pixel region GAR at a region directly above photodiode PD (PD1, PD2) and having insulating liner layer LL1 removed therefrom. In other words, opening LL1a is a portion located in pixel region GAR at a region directly above a photoelectric conversion unit of a photoelectric conversion device and having insulating liner layer LL1 removed therefrom. Note that opening LL1a may not only be provided in a region directly above photodiode PD (PD1, PD2) but also be provided in a region directly above another region (e.g., a region having transferring transistor TTR formed therein).

Opening LL1b is a portion located in removal provision region OFR and having insulating liner layer LL1 removed therefrom. No device is formed in the entire region of the main surface of semiconductor substrate SUB located directly under opening LL1b. In the present embodiment, well region (an active region) WL3 of a single conduction type (e.g., p type) surrounded by element isolating insulating layer SI is formed in the entire region of the main surface of semiconductor substrate SUB located directly under opening LL1b.

Pixel region GAR, peripheral circuit region PCH, PCV, and removal provision region OFR each have an interlayer insulating layer II3 formed therein to cover insulating liner layer LL1. Interlayer insulating layer II3 is made for example of silicon oxide film. Interlayer insulating layer II3 is buried in openings LL1a, LL1b of insulating liner layer LL1. Interlayer insulating layer II3 has a plurality of through holes (not shown) formed therein to reach each interconnect layer IC1 and the like. A buried conducting layer (not shown) is buried in each through hole.

On a surface of interlayer insulating layer II3, an interlayer insulating layer II4 is formed. Interlayer insulating layer II4 is made for example of silicon oxide film. Interlayer insulating layer II4 has an interconnecting trench TR2 formed therein. In interconnecting trench TR2, an interconnect layer IC2 is formed. Interconnect layer IC2 is made of material containing copper, and it is made of material such as for example copper and copper aluminum.

Interconnect layer IC2 is covered with an insulating liner layer LL2 formed on interlayer insulating layer II4. Insulating liner layer LL2 is for preventing diffusion of copper contained in interconnect layer IC2. Insulating liner layer LL2 is made of material containing nitrogen, and it is made of material such as for example silicon nitride and silicon carbonitride.

Insulating liner layer LL2 has openings LL2a, LL2b formed therein. Opening LL2a is a portion located in pixel region GAR at a region directly above photodiode PD (PD1, PD2) and having insulating liner layer LL2 removed therefrom. In other words, opening LL2a is a portion located in pixel region GAR at a region directly above a photoelectric conversion unit of a photoelectric conversion device and having insulating liner layer LL2 removed therefrom. Note that opening LL2a may not only be provided in a region directly above photodiode PD (PD1, PD2) but also be provided in a region directly above another region (e.g., a region having transferring transistor TTR formed therein).

Opening LL2b is a portion located in removal provision region OFR and having insulating liner layer LL2 removed therefrom. No device is formed in the entire region of the main surface of semiconductor substrate SUB located directly under opening LL2b. In the present embodiment, well region (an active region) WL3 of a single conduction type (e.g., p type) surrounded by element isolating insulating layer SI is formed in the entire region of the main surface of semiconductor substrate SUB located directly under opening LL2b.

On insulating liner layer LL2 are formed interlayer insulating layers II5, II6, an interconnecting trench TR3, an interconnect layer IC3, an insulating liner layer LL3, etc. Interlayer insulating layer II5 is substantially identical to interlayer insulating layer II3, and interlayer insulating layer II6 is substantially identical to interlayer insulating layer II4. Interconnecting trench TR3 is substantially identical to interconnecting trench TR2, interconnect layer IC3 is substantially identical to interconnect layer IC2, and insulating liner layer LL3 is substantially identical to insulating liner layer LL2. Accordingly, interlayer insulating layers II5, II6, interconnecting trench TR3, interconnect layer IC3, and insulating liner layer LL3 will not be described redundantly.

Furthermore, on insulating liner layer LL3 are provided interlayer insulating layers II7, II8, an interconnecting trench TR4, an interconnect layer IC4, an insulating liner layer LL4, etc. Interlayer insulating layer II7 is substantially identical to interlayer insulating layer II3, and interlayer insulating layer II8 is substantially identical to interlayer insulating layer II4. Interconnecting trench TR4 is substantially identical to interconnecting trench TR2, interconnect layer IC4 is substantially identical to interconnect layer IC2, and insulating liner layer LL4 is substantially identical to insulating liner layer LL2. Accordingly, interlayer insulating layers II7, II8, interconnecting trench TR4, interconnect layer IC4, and insulating liner layer LL4 will not be described redundantly.

Insulating liner layer LL4 is covered with an interlayer insulating layer II9. Interlayer insulating layer II9 is made for example of the silicon oxide film.

In pixel region GAR on interlayer insulating layer II9 microlenses LE1 and LE2 are formed with color filters CF1 and CF2 interposed.

In peripheral circuit region PCH, PCV and removal provision region OFR on interlayer insulating layer II9 an interconnect layer PAD configuring a pad electrode is formed. Interconnect layer PAD is covered with an insulating layer IL and a passivation layer PS stacked sequentially.

Pixel region GAR has a plurality of insulating liner layers LL1-LL4 respectively having openings LL1a-LL4a located in a region directly above photodiode PD (PD1, PD2) and overlapping each other in a plan view. The plurality of openings LL1a-LL4a configure an intra-pixel removal part OPB. That is, a region having the plurality of openings LL1a-LL4a overlapping each other in a plan view configures intra-pixel removal part OPB. Intra-pixel removal part OPB is provided for each single photodiode PD (PD1, PD2). That is, a single intra-pixel removal part OPB is provided over photodiode PD1, and a single intra-pixel removal part OPB is provided over photodiode PD2. Thus a plurality of intra-pixel removal parts OPBs configure an intra-pixel removal region. That is, insulating liner layers LL1-LL4 have in pixel region GAR intra-pixel removal region OPB having insulating liner layers LL1-LL4 removed therefrom, and intra-pixel removal region OPB includes a plurality of intra-pixel removal parts OPBs each located in a region directly above a respective one of diodes PDs (PD1, PD2) of a plurality of photoelectric conversion devices PXPs and having insulating liner layers LL1-LL4 removed therefrom.

Insulating liner layers LL1-LL4 are not removed in pixel region GAR except a region having opening LL1a-LL4a formed therein and a region having a via hole formed therein. That is, pixel region GAR other than the region having opening LL1a-LL4a formed therein and the region having the via hole formed therein is covered with insulating liner layers LL1-LL4.

Removal provision region OFR has the plurality of insulating liner layers LL1-LL4 respectively having openings LL1b-LL4b overlapping each other in a plan view. The plurality of openings LL1b-LL4b configure extra-pixel removal region OPR. That is, a region having the plurality of openings LL1b-LL4b (a plurality of extra-pixel removed portions) overlapping each other in a plan view configures extra-pixel removal region OPR. That is, extra-pixel removal region OPR has extra-pixel removed portions LL1b-LL4b formed in the plurality of insulating liner layers LL1-LL4, respectively. Removal provision region OFR other than extra-pixel removal region OPR is covered with insulating liner layers LL1-LL4.

Well region (an active region) WL3 of a single conduction type (e.g., p type) surrounded by element isolating insulating layer SI is formed in the entire region of the main surface of semiconductor substrate SUB located directly under extra-pixel removal region OPR. Note that p type well region WL3 may be dispensed with. In that case, n well region (an active region) WL2 surrounded by element isolating insulating layer SI may be located in the entire region of the main surface of semiconductor substrate SUB located directly under extra-pixel removal region OPR.

Extra-pixel removal region OPR is located only in removal provision region OFR in a plan view, and does not lie off removal provision region OFR. Thus, extra-pixel removal region OPR does not extend into peripheral circuit region PCH, PCV or pixel region GAR in a plan view.

Figure 6:
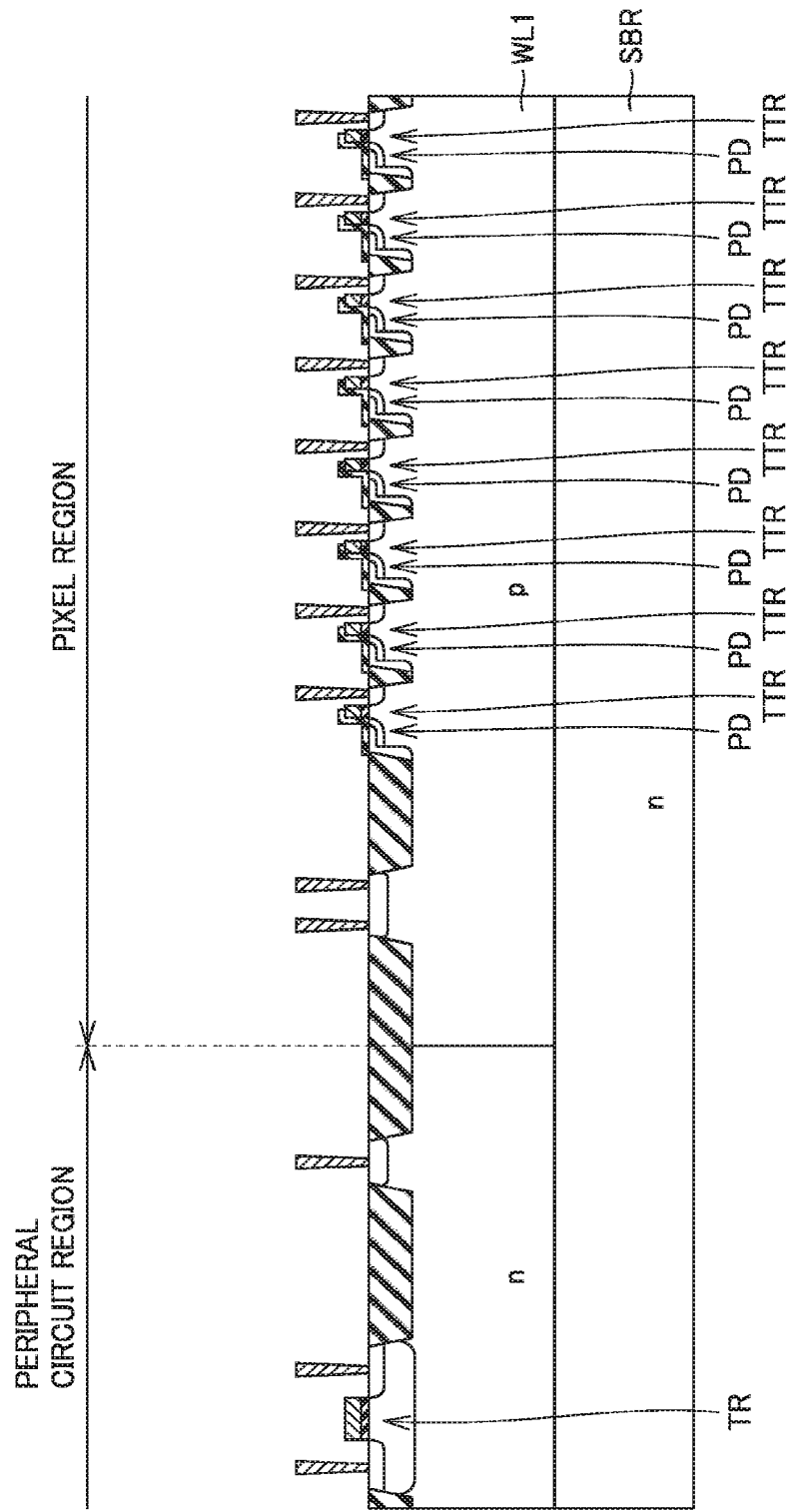
FIG. 6 is a schematic cross section for illustrating a boundary of the pixel region and another region in an image pickup device in one embodiment.

Extra-pixel removal region OPR is provided in removal provision region OFR, which is, as has been discussed above, disposed outside rectangular pixel region GAR in a plan view. Herein, pixel region GAR and peripheral circuit region PCH, PCV have a boundary provided by a pn junction of p type well region WL1 and n type well region WL2, as shown in FIG. 6. Furthermore, pixel region GAR and removal provision region OFR also have a boundary provided by a pn junction of p type well region WL1 and n type well region WL2, similarly as described with reference to FIG. 6.

Furthermore, if pixel region GAR should be formed in an n type well region and peripheral circuit region PCH, PCV and removal provision region OFR should each be formed in a p type well region, then, the pn junction of the n type well region and the p type well region will serve as the above boundary.

Accordingly, extra-pixel removal region OPR is formed in removal provision region OFR located directly above a well region other than a well region provided with pixel region GAR While in the above is described an example providing a plurality of insulating liner layers LL1-LL4, if only a single insulating liner layer LL1 is provided, then, extra-pixel removal region OPR will be configured only by opening LL1b formed in insulating liner layer LL1.

Figure 7:
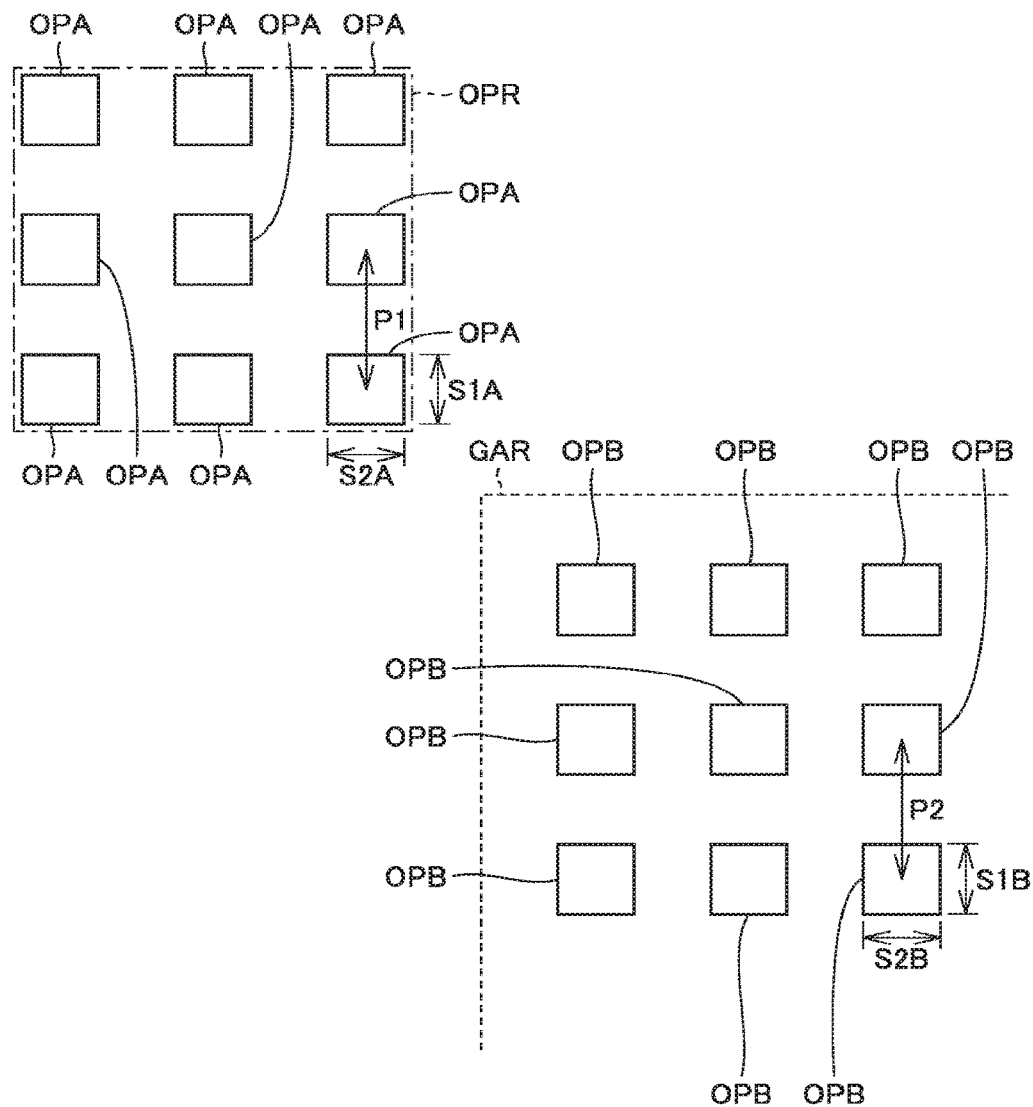
FIG. 7 is a schematic plan view for illustrating a configuration of an extra-pixel removal region in the image pickup device shown in FIG. 1.

As shown in FIG. 2, a single extra-pixel removal region OPR disposed at each of the four corners of rectangular pixel region GAR may have a configuration provided with only a single extra-pixel removal part OPA. Furthermore, as shown in FIG. 7, a single extra-pixel removal region OPR disposed at each of the four corners of rectangular pixel region GAR may have a configuration having a plurality of extra-pixel removal parts OPAs arranged in rows and columns.

The plurality of extra-pixel removal parts OPAs included in the single extra-pixel removal region OPR may have the same planar geometry and arrangement as a plurality of intra-pixel removal parts OPBs formed in pixel region GAR. Specifically, a single extra-pixel removal part OPA and a single intra-pixel removal part OPB may have the same planar geometry, and dimensions S1A and S2A of sides of extra-pixel removal part OPA may be the same as dimensions S1B and S2B of sides of intra-pixel removal part OPB. Furthermore, a pitch P1 applied to dispose a plurality of extra-pixel removal parts OPAs in rows and columns may be the same as a pitch P2 applied to dispose a plurality of intra-pixel removal parts OPBs in rows and columns.

Furthermore, as shown in FIG. 1, extra-pixel removal region OPR may be formed in line symmetry with respect to an imaginary centerline (a line A-A or a line B-B) passing through a center O of pixel region GAR located at the main surface of semiconductor substrate SUB.

Figure 8:
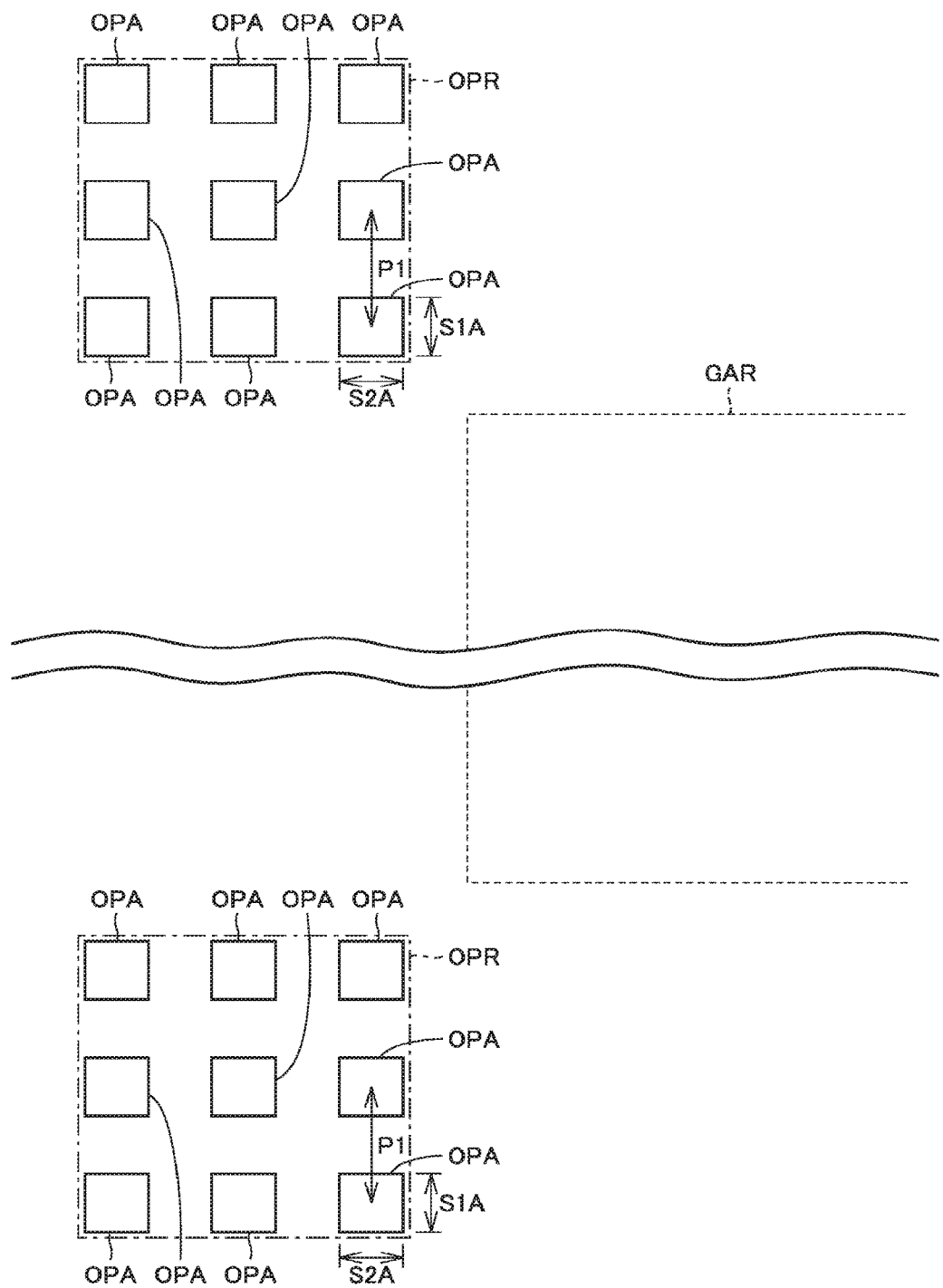
FIG. 8 is a schematic plan view for illustrating a configuration of an extra-pixel removal region in the image pickup device shown in FIG. 1.

In that case, as shown in FIG. 8, dimensions S1A, S2A of sides of extra-pixel removal part OPA in one extra-pixel removal region OPR are the same as dimensions S1A, S2A of sides of extra-pixel removal part OPA in the other extra-pixel removal region OPR located in line symmetry with the one extra-pixel removal region OPR. Furthermore, pitch P1 applied to dispose in rows and columns a plurality of extra-pixel removal parts OPAs in one extra-pixel removal region OPR is the same as pitch P1 applied to dispose in rows and columns a plurality of extra-pixel removal parts OPAs in the other extra-pixel removal region OPR located in line symmetry with the one extra-pixel removal region OPR.

Furthermore, extra-pixel removal region OPR may be formed in point symmetry with respect to center O of pixel region GAR located at the main surface of semiconductor substrate SUB. In that case also, dimensions S1A, S2A of sides of extra-pixel removal part OPA in one extra-pixel removal region OPR are the same as dimensions S1A, S2A of sides of extra-pixel removal part OPA in the other extra-pixel removal region OPR located in point symmetry with the one extra-pixel removal region OPR. Furthermore, pitch P1 applied to dispose in rows and columns a plurality of extra-pixel removal parts OPAs in one extra-pixel removal region OPR is the same as pitch P1 applied to dispose in rows and columns a plurality of extra-pixel removal parts OPAs in the other extra-pixel removal region OPR located in point symmetry with the one extra-pixel removal region OPR.

Hereinafter reference will be made to FIGS. 9-13 to describe a method for manufacturing the image pickup device of the present embodiment.

Figure 9:
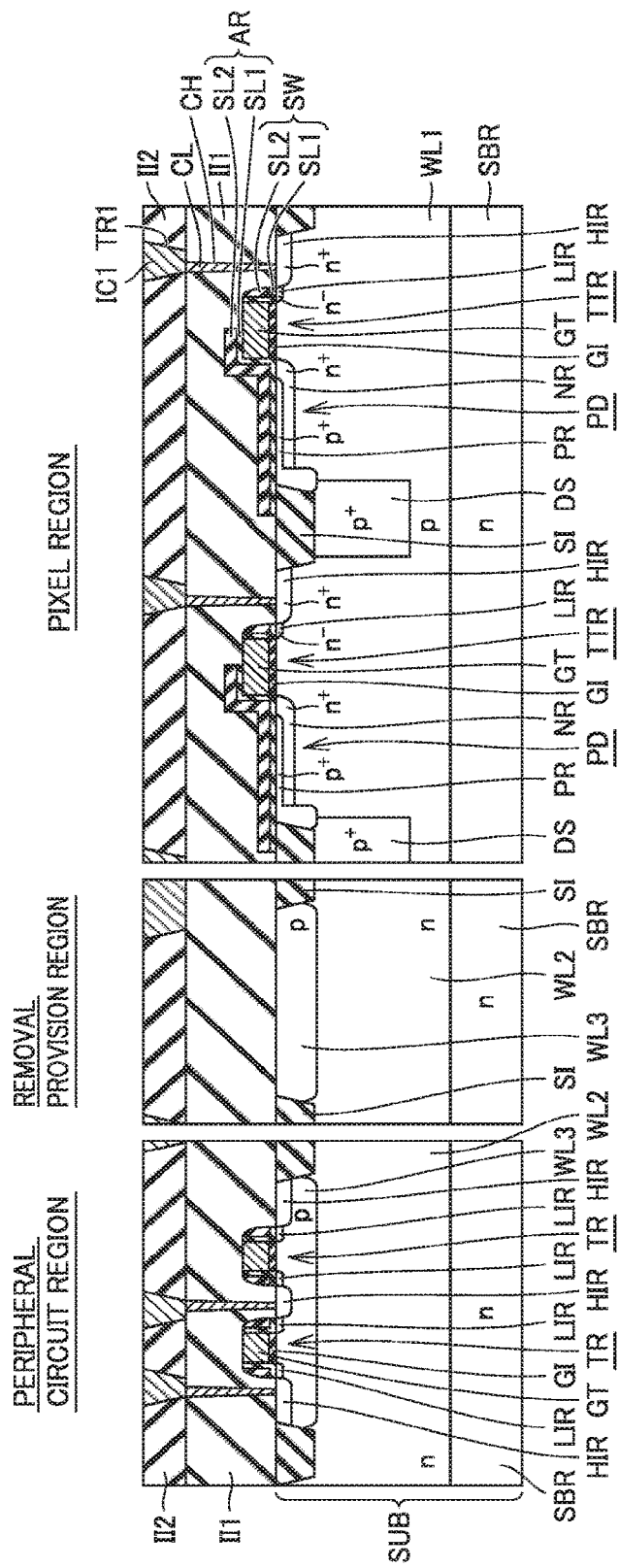
FIG. 9 to FIG. 13 are schematic cross sections showing a method for manufacturing an image pickup device in one embodiment, as presented in an order of its steps.

As shown in FIG. 9, semiconductor substrate SUB is prepared that mainly has n type region SBR, p type well region WL1, n type well region WL2, element isolating insulating layer SI, and element isolating region (a p+ region) DS. Semiconductor substrate SUB is prepared to have a main surface with rectangular pixel region GAR and have peripheral circuit region PCH, PCV and removal provision region OFR outside pixel region GAR.

In pixel region GAR, a plurality of pixels PXPs (photoelectric conversion devices) are formed at the main surface of semiconductor substrate SUB. The plurality of pixels PXPs each have a configuration as shown in FIG. 3 and FIG. 4. Furthermore, in peripheral circuit region PCH, PCV, transistor TR and the like are formed for controlling the plurality of pixels PXPs in pixel region GAR. Furthermore, in removal provision region OFR, for example, no device is formed and a single well region WL3 surrounded by element isolating insulating layer SI is formed.

In each of pixel region GAR, peripheral circuit region PCH, PCV, and removal provision region OFR, interlayer insulating layer II1 formed for example of silicon oxide is formed on the main surface of semiconductor substrate SUB. Interlayer insulating layer II1 is formed to cover photodiode PD, a variety of transistors, etc.

Interlayer insulating layer II1 has an upper surface planarized by a planarization process. Thereafter, a normal photomechanical process and a normal etching technique are employed to provide interlayer insulating layer II1 with contact hole CH. Buried conducting layer CL is buried in contact hole CH.

On interlayer insulating layer II1, interlayer insulating layer II2 is formed for example of silicon oxide. Interlayer insulating layer II2 has an upper surface planarized by a planarization process. Thereafter, a normal photomechanical process and a normal etching technique are employed to provide interlayer insulating layer II2 with interconnecting trench TR1. Conducting layer IC1 containing copper is formed on an upper surface of interlayer insulating layer II2 such that conducting layer IC1 is buried in interconnecting trench TR1.

Conducting layer IC1 containing copper is chemically mechanically polished and thus removed to expose an upper surface of interlayer insulating layer II2. Thus, conducting layer IC1 containing copper is left only in interconnecting trench TR1. Thus, interconnect layer IC1 formed of conducting layer IC1 containing copper is formed in interconnecting trench TR1.

Figure 10:
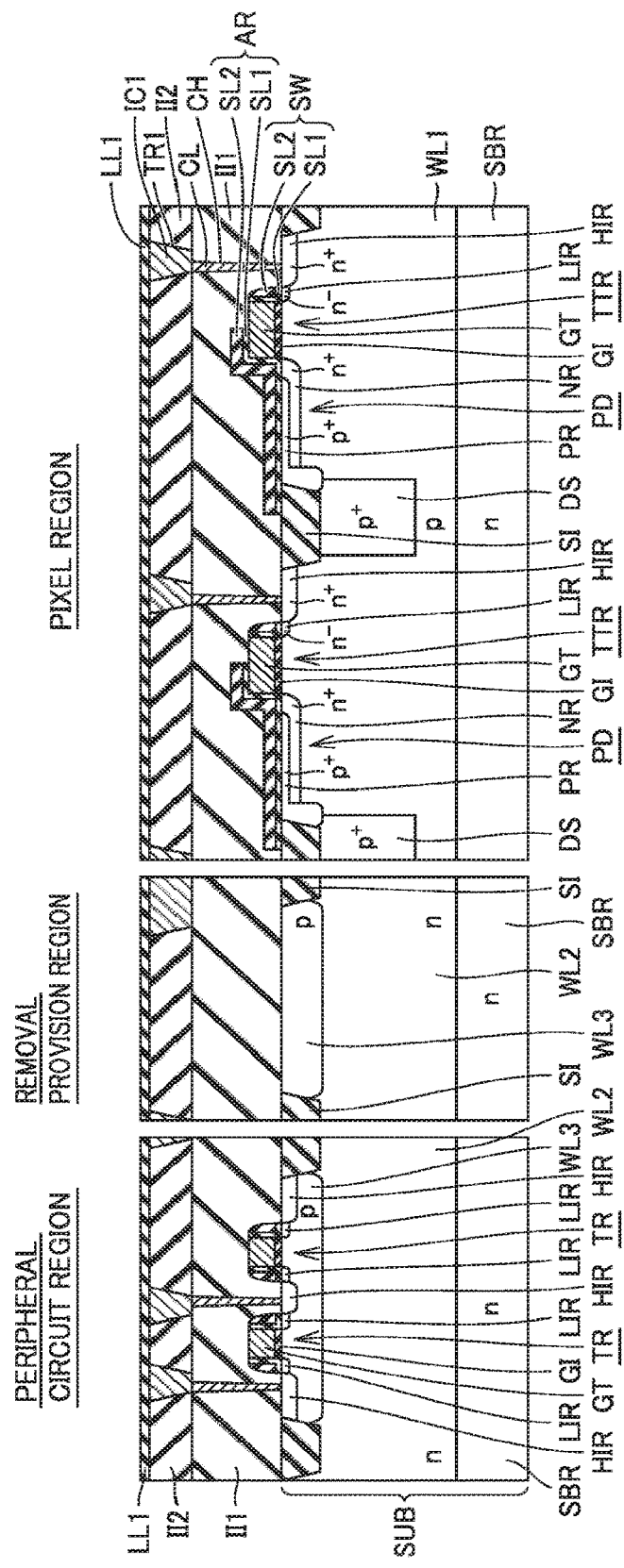

As shown in FIG. 10, insulating liner layer LL1 is formed on interlayer insulating layer II2. Insulating liner layer LL1 is formed of material containing nitrogen, and it is formed of material such as for example silicon nitride and silicon carbonitride. Insulating liner layer LL1 is formed so that it is in contact with an upper surface of interconnect layer IC1 and also covers interconnect layer IC1.

Figure 11:
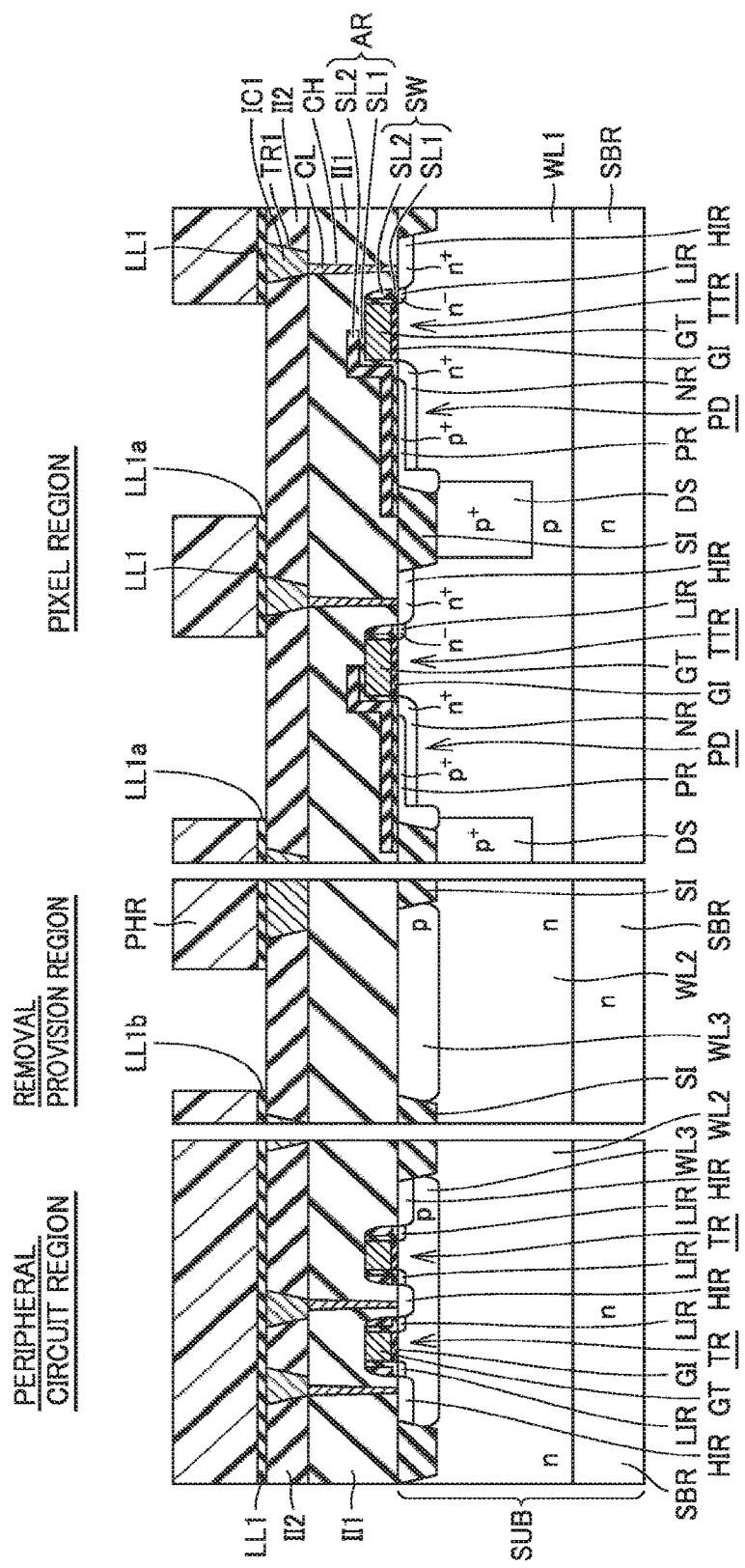

As shown in FIG. 11, photoresist PHR is applied on insulating liner layer LL1. Photoresist PHR is exposed and developed and thus patterned to form a resist pattern PHR. Insulating liner layer LL1 is etched with resist pattern PHR used as a mask.

This etching partially removes insulating liner layer LL1 and thus forms opening LL1a and opening LL1b. Opening LL1a is formed to be in pixel region GAR at a region directly above photodiode PD. Opening LL1b is formed in removal provision region OFR. Subsequently, resist pattern PHR is removed for example by ashing etc.

Figure 12:
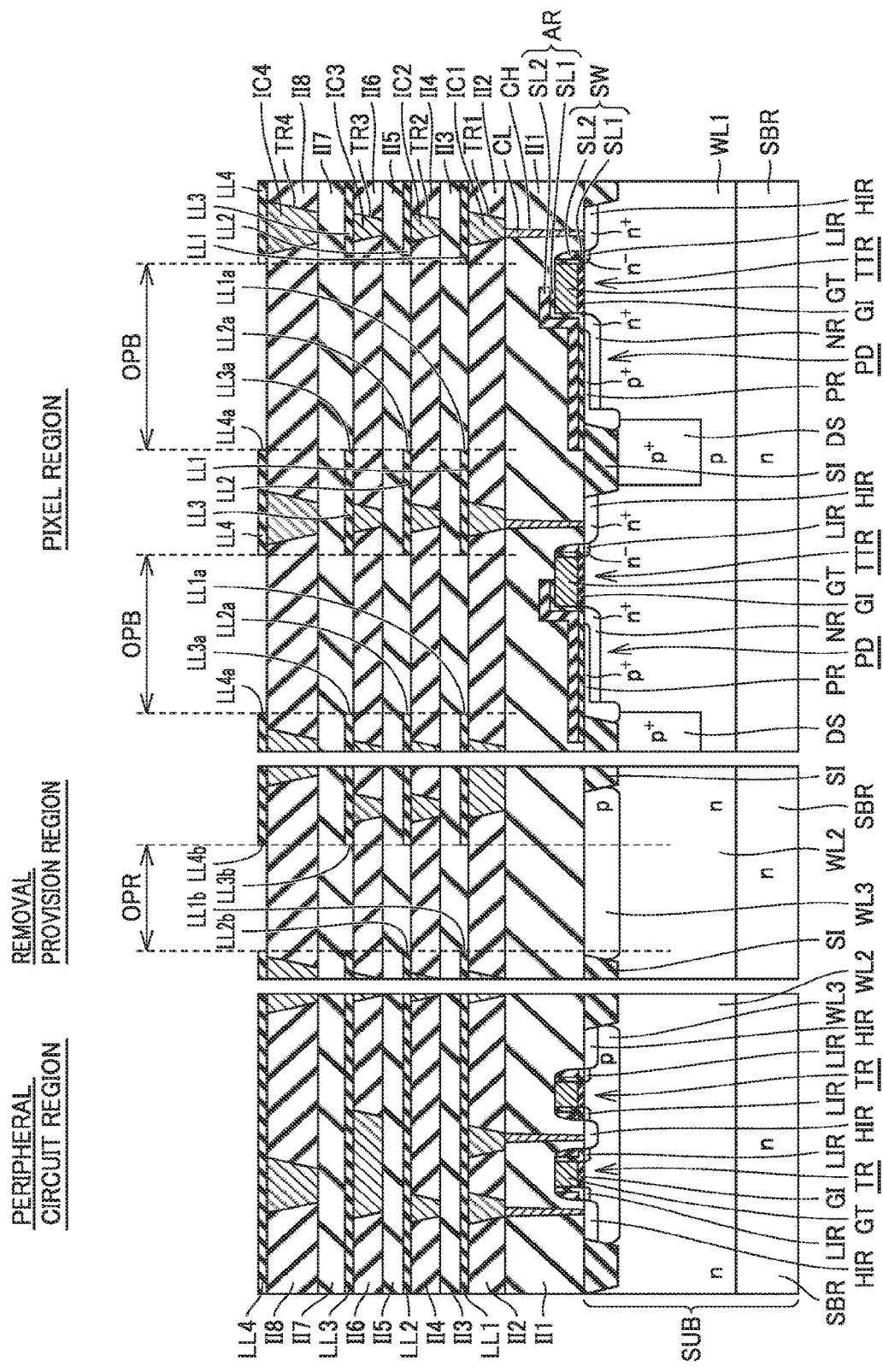

As shown in FIG. 12, a process is repeated that is similar to the above described process for forming interlayer insulating layers II1, II2, interconnecting trench TR1, interconnect layer IC1, insulating liner layer LL1, and openings LL1a, LL1b. Interlayer insulating layers II3-II8, interconnecting trenches TR2-TR4, interconnect layers IC2-IC4, insulating liner layers LL2-LL4, openings LL2a-LL4a, LL2b-LL4b, etc. are thus formed.

In pixel region GAR, openings LL1a-LL4a are formed to be positioned in a region directly above photodiode PD (PD1 PD2) and overlap each other in a plan view. The plurality of openings LL1a-LL4a configure intra-pixel removal part OPB.

In removal provision region OFR, openings LL1b-LL4b are formed to overlap each other in a plan view. The plurality of openings LL1b-LL4b configure extra-pixel removal region OPR.

Figure 13:
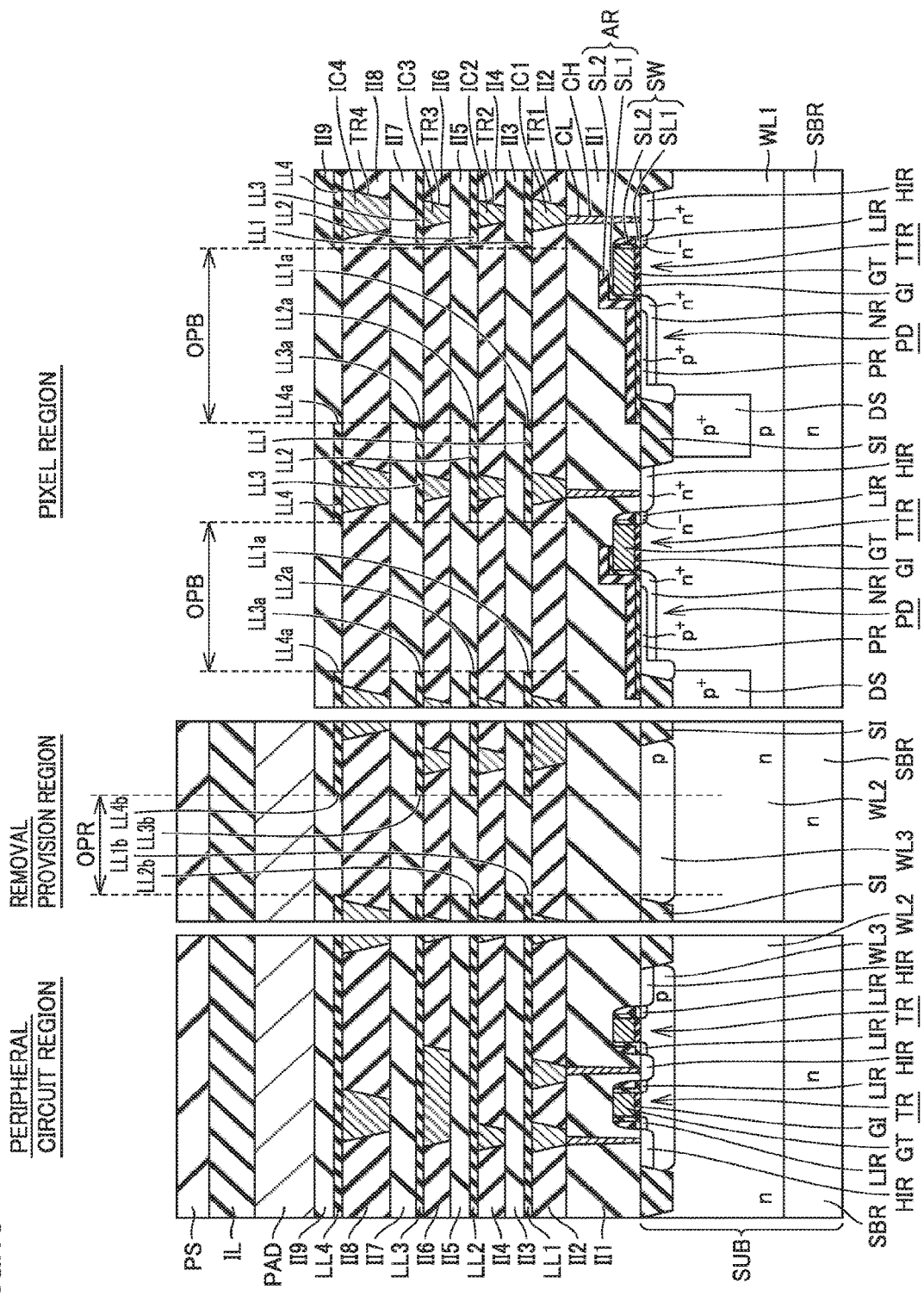

As shown in FIG. 13, in each of pixel region GAR, peripheral circuit region PCH, PCV, and removal provision region OFR, interlayer insulating layer II9 made for example of silicon oxide is formed on interlayer insulating layer II8. In each of peripheral circuit region PCH, PCV and removal provision region OFR, interconnect layer PAD for a pad is formed on interlayer insulating layer II9. In each of peripheral circuit region PCH, PCV and removal provision region OFR, insulating layer IL and passivation layer PS are formed to cover interconnect layer PAD for the pad. Passivation layer PS is formed for example of silicon nitride.

Subsequently, a sintering process is performed as a heat treatment at a temperature of about 400 degrees centigrade in an atmosphere of hydrogen gas. By this process, hydrogen diffuses throughout interlayer insulating layers II1-II9 and terminates a dangling bond of an interface of semiconductor substrate SUB and gate insulating layer GI.

As shown in FIG. 5, in pixel region GAR, color filters CF1 and CF2 are formed on interlayer insulating layer II9. Microlenses LE1 and LE2 are formed on color filters CF1 and CF2, and the image pickup device of the present embodiment is thus produced.

The present embodiment provides a function and effect, as described hereinafter.

According to the present embodiment, as shown in FIG. 5, interconnect layers IC1-IC4 made of a material containing copper have their upper surfaces covered with insulating liner layers LL1-LL4 made of a material containing nitrogen, respectively. This allows insulating liner layers LL1-LL4 to suppress diffusion of copper contained in interconnect layers IC1-IC4. This can suppress an erroneous operation of a transistor that would otherwise be caused by copper diffusing to the transistor.

Furthermore, as shown in FIG. 1, extra-pixel removal region OPR is provided in a region of the vertical angle of at least one of four corners AGs of pixel region GAR (i.e., in removal provision region OFR). Extra-pixel removal region OPR has insulating liner layers LL1-LL4 removed therefrom. Thus, when the above sintering process is performed, hydrogen passes through extra-pixel removal region OPR to facilitate terminating a dangling bond of an interface of semiconductor substrate SUB and gate insulating layer GI in a vicinity of four corners AGs of pixel region GAR. This can suppress degradation of dark characteristics at the four corners of a pixel sensor area.

Thus, an image pickup device that can suppress degradation of dark characteristics at the four corners of a pixel sensor area and can also suppress an erroneous operation of a transistor, and a method for manufacturing the same, can be implemented.

Furthermore, pixel region GAR other than intra-pixel removal part OPB and a region having a via hole formed therein is covered with each of insulating liner layers LL1-LL4. This can suppress diffusion to a transistor of potassium contained in a slurry of the CMP performed in forming interconnect layers IC1-IC5 as described above. This can also suppress an erroneous operation of the transistor.

Furthermore, extra-pixel removal region OPR is located only in a region of a vertical angle (i.e., in removal provision region OFR). This further suppresses diffusion to a transistor of the copper in interconnect layers IC1-IC4 and the potassium that is contained in the slurry of the CMP in a region other than the region of the vertical angle (i.e., removal provision region OFR), i.e., pixel region GAR and peripheral circuit region PCH, PCV. This can further suppress an erroneous operation of the transistor.

Furthermore, as shown in FIG. 5, the entire region of the main surface of semiconductor substrate SUB located directly under extra-pixel removal region OPR has formed therein active region WL3 of a single conduction type surrounded by element isolating insulating layer SI, and does not have any device formed therein. As the entire region of the main surface of semiconductor substrate SUB located directly under extra-pixel removal region OPR does not have any device formed therein, an erroneous operation that would otherwise be caused as the copper in interconnect layers IC1-IC4 reaches the device will never be caused.

Furthermore, as shown in FIG. 7, extra-pixel removal region OPR has a configuration having a plurality of extra-pixel removal parts OPAs disposed in rows and columns. Furthermore, the plurality of extra-pixel removal parts OPAs and a plurality of intra-pixel removal parts OPBs have mutually identical planar geometries. This facilitates designing a photomask used in exposing a pattern of removal parts OPAs and OPBs. Furthermore, removal parts OPAs and OPBs having mutually identical planar geometries allow a production process to be performed with reduced variation and pixel region GAR to have a plurality of intra-pixel removal parts OPBs having planar geometries, respectively, improved in uniformity.

Furthermore, as shown in FIG. 1, extra-pixel removal region OPR is formed in line symmetry with respect to an imaginary centerline (line A-A, line B-B) passing through center O of pixel region GAR located at the main surface of semiconductor substrate SUB. Furthermore, extra-pixel removal region OPR is formed in point symmetry with respect to center O of pixel region GAR located at the main surface of semiconductor substrate SUB. This can uniformly suppress degradation of dark characteristics at the four corners of rectangular pixel region GAR.

In the above, a case of an image pickup device of the front-side illumination (FSI) type as shown in FIG. 5 has been described. However, as shown in FIG. 14, a BSI type image pickup device may have extra-pixel removal region OPR in a region of the vertical angle of at least one of four corners AGs of pixel region GAR (i.e., in removal provision region OFR), as shown in FIG. 1.

Note that the BSI type image pickup device has color filters CF1, CF2 and microlenses LE1, LE2 provided on a back side of semiconductor substrate SUB.

Figure 14:
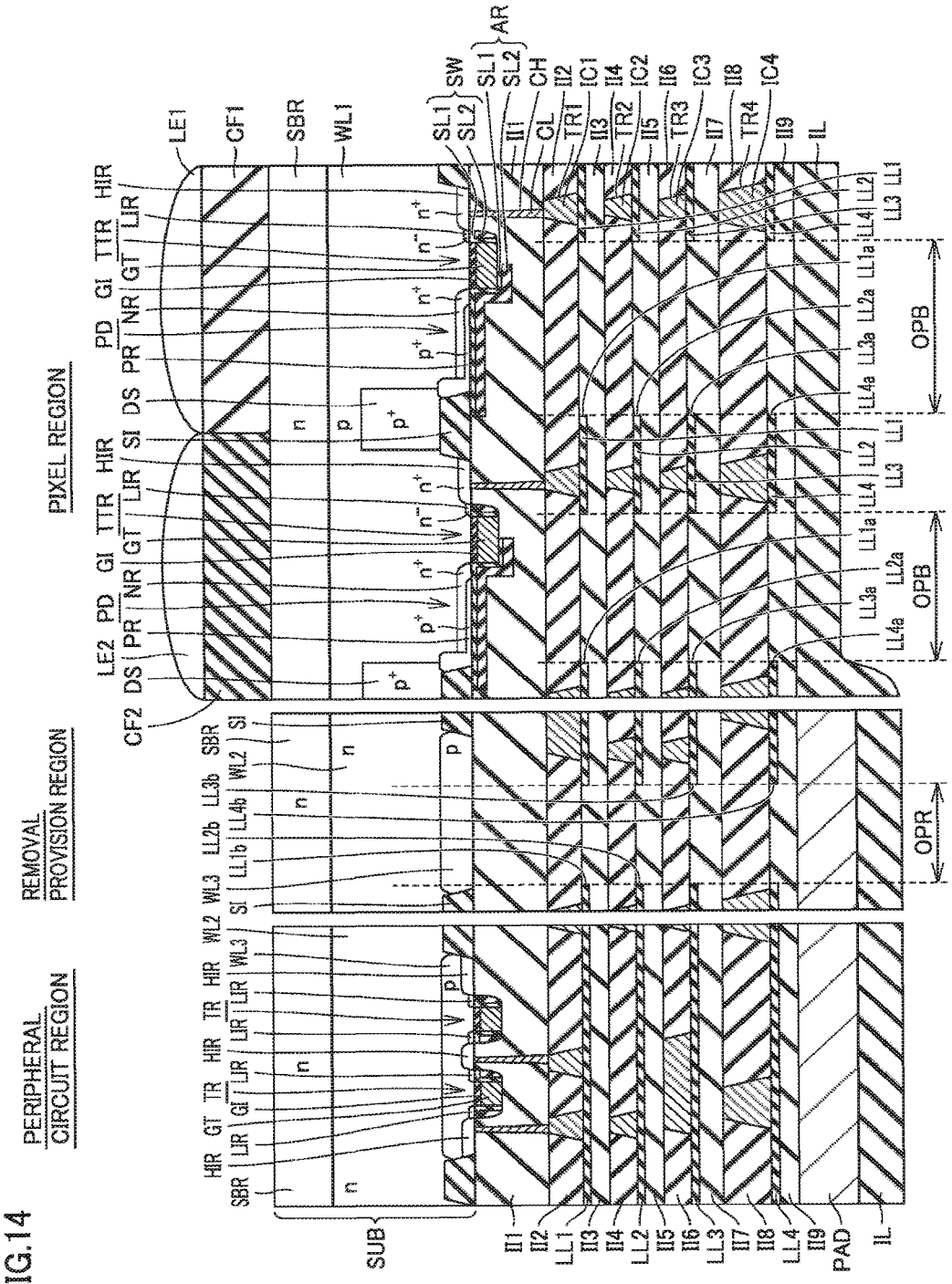
FIG. 14 is a cross section schematically showing a configuration of a back-side illumination (BSI) type image pickup device as a configuration of an exemplary variation of an image pickup device in one embodiment.

The remainder of the BSI type image pickup device shown in FIG. 14 is substantially the same in configuration as that of the FSI type image pickup device shown in FIG. 1 to FIG. 5, and accordingly, identical components are identically denoted and will not be described repeatedly.

The BSI type image pickup device shown in FIG. 14 also has extra-pixel removal region OPR located in a region of a vertical angle of at least one of four corners AGs of pixel region GAR (i.e., in removal provision region OFR) and having insulating liner layers LL1-LL4 removed therefrom. Thus, as well as the image pickup device shown in FIG. 1 to FIG. 5, an image pickup device that can suppress degradation of dark characteristics at the four corners of a pixel sensor area and can suppress an erroneous operation of a transistor, and a method for manufacturing the same, can be implemented.

Figure 15:
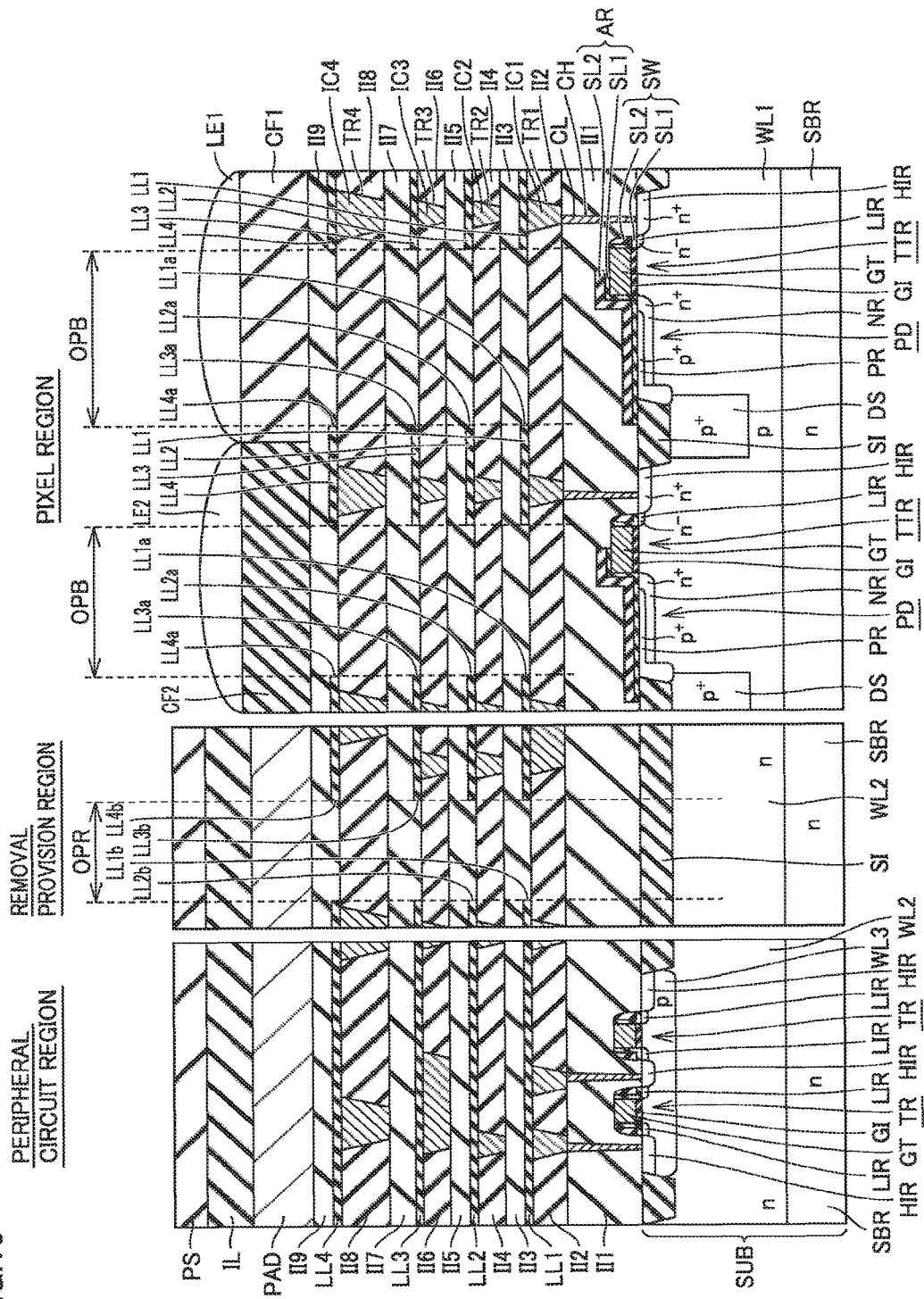
FIG. 15 is a cross section schematically showing as a configuration of an exemplary variation of an image pickup device in one embodiment a configuration in which an element isolating insulating layer is deposited in the entire region of a main surface of a semiconductor substrate located directly under an extra-pixel removal region.

As shown in FIG. 15, the entire region of the main surface of semiconductor substrate SUB located directly under extra-pixel removal region OPR may not have any device formed therein, and may have element isolating insulating layer SI formed therein. As the entire region of the main surface of semiconductor substrate SUB located directly under extra-pixel removal region OPR does not have any device formed therein, an erroneous operation that would otherwise be caused as the copper in interconnect layers IC1-IC4 reaches the device will never be caused.

Figure 16:
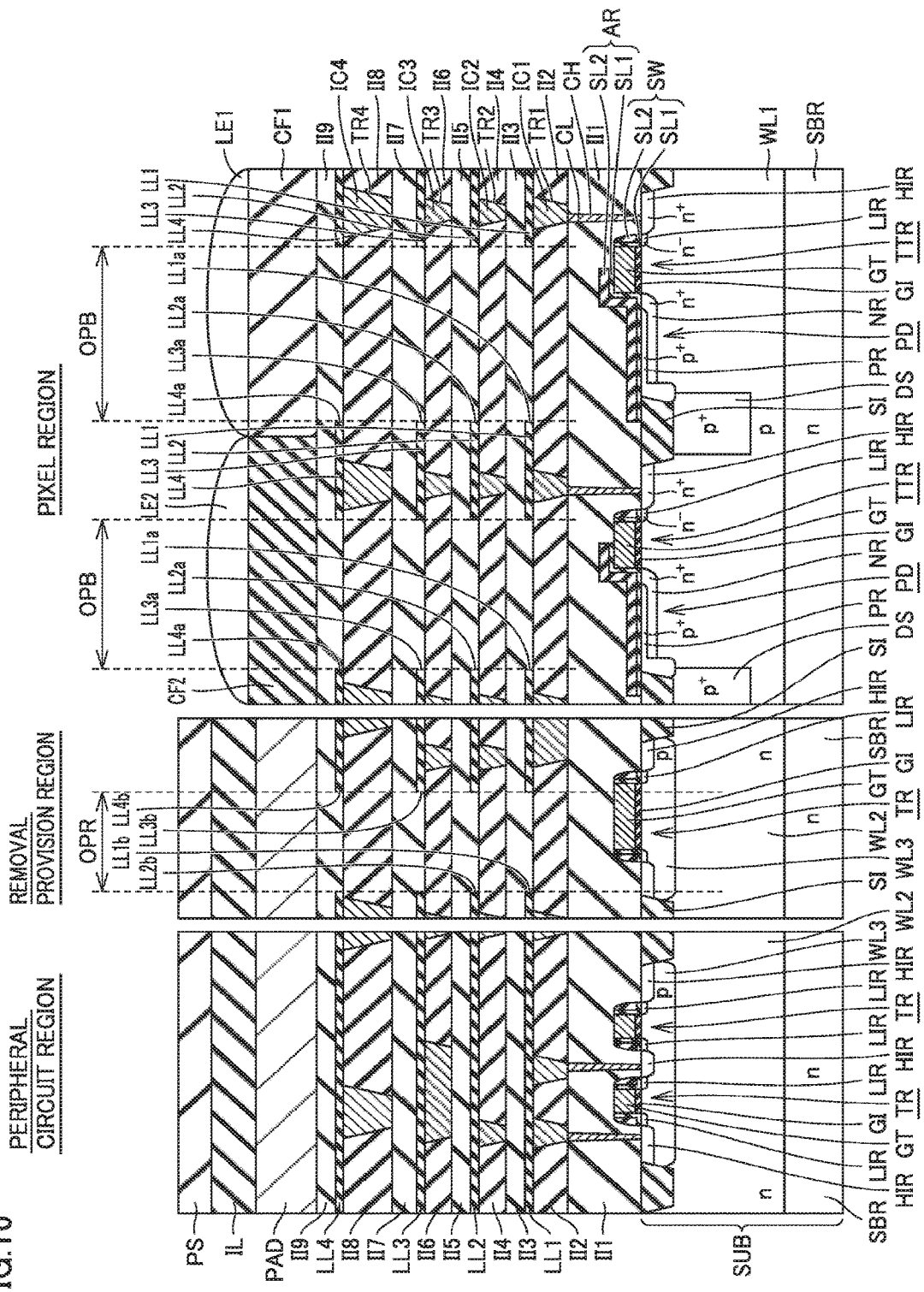
FIG. 16 is a cross section schematically showing as a configuration of an exemplary variation of an image pickup device in one embodiment a configuration in which a transistor is formed at a main surface of a semiconductor substrate located directly under an extra-pixel removal region.

Furthermore, as shown in FIG. 16, an insulated gate field effect transistor such as MOS transistor TR may be formed at the main surface of semiconductor substrate SUB located directly under extra-pixel removal region OPR.

MOS transistor TR directly under extra-pixel removal region OPR is substantially identical in configuration to transistor TR provided in peripheral circuit region PCH, PCV. It should be noted, however, that MOS transistor TR directly under extra-pixel removal region OPR is designed by a larger design rule than a transistor provided in pixel region GAR and transistor TR provided in the peripheral circuit region. Accordingly, MOS transistor TR directly under extra-pixel removal region OPR has a larger gate length than the transistor provided in pixel region GAR and transistor TR provided in the peripheral circuit region.

Figure 17:
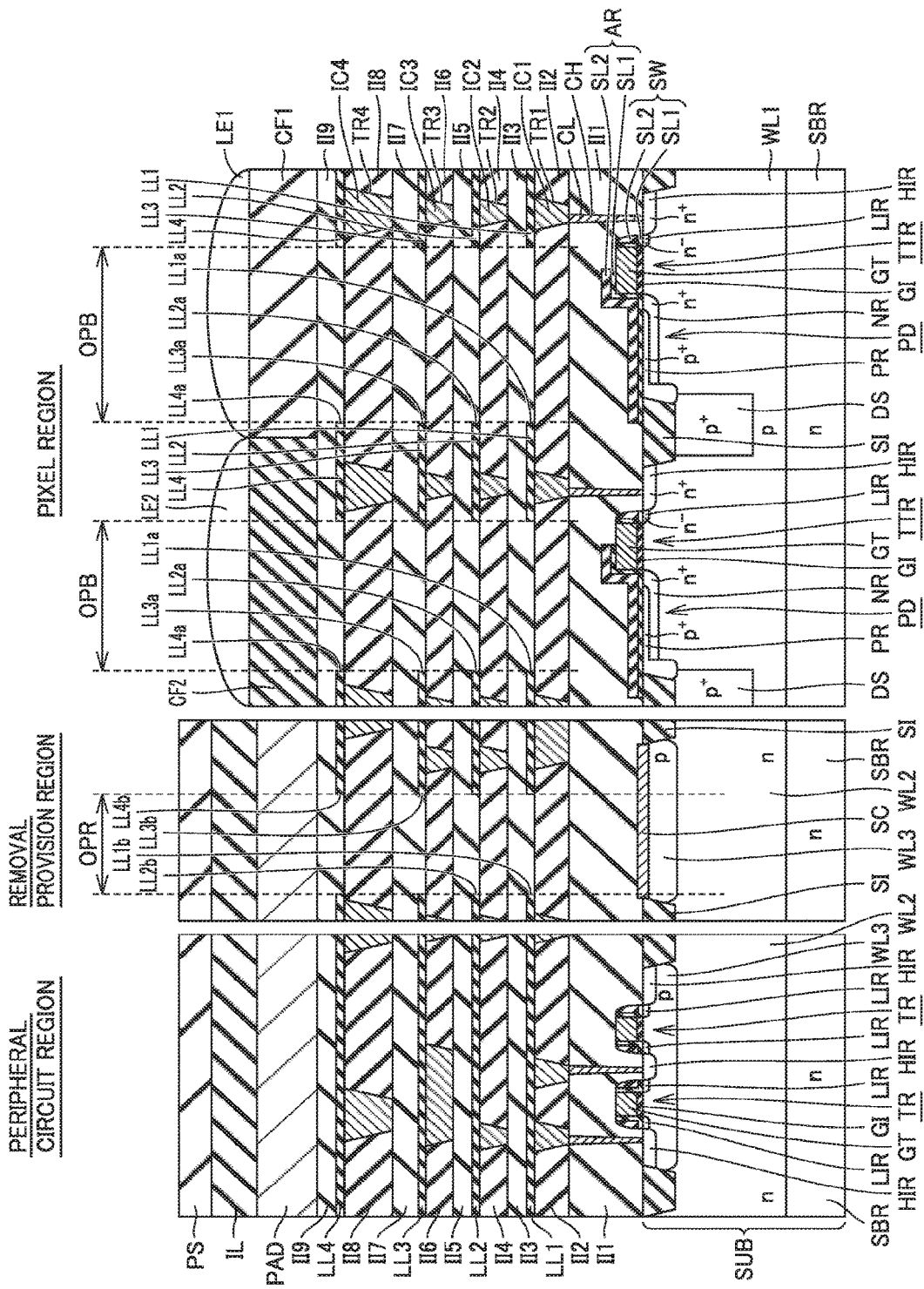
FIG. 17 is a cross section schematically showing as a configuration of an exemplary variation of an image pickup device in one embodiment a configuration in which a resistance formed of a silicide layer is formed at a main surface of a semiconductor substrate located directly under an extra-pixel removal region.

Furthermore, as shown in FIG. 17, resistance SC made of a silicide layer may be formed at the main surface of semiconductor substrate SUB located directly under extra-pixel removal region OPR.

Figure 18:
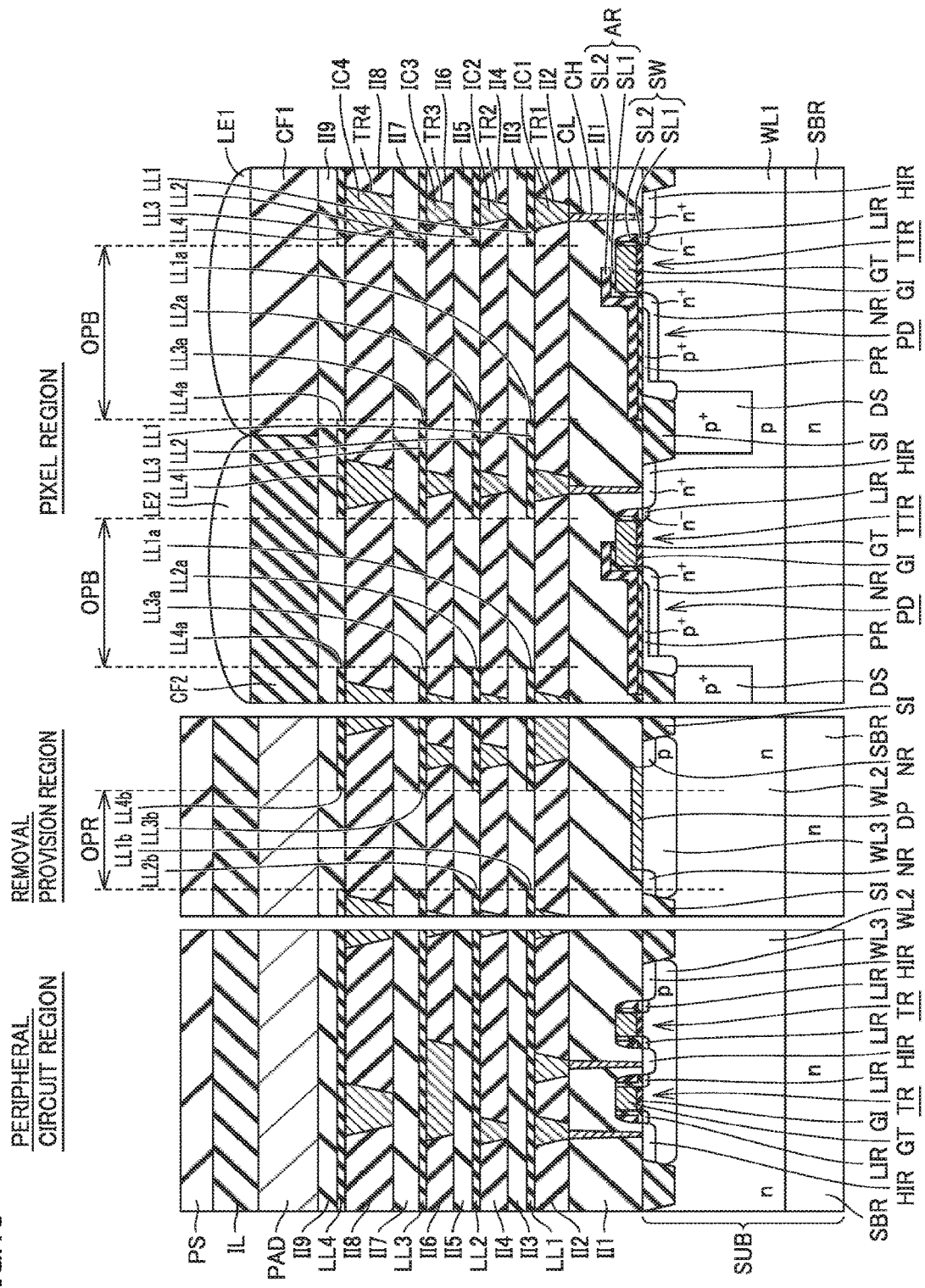
FIG. 18 is a cross section schematically showing as a configuration of an exemplary variation of an image pickup device in one embodiment a configuration in which a resistance formed of doped polycrystalline silicon is formed on a main surface of a semiconductor substrate located directly under an extra-pixel removal region.

Furthermore, as shown in FIG. 18, resistance DP made of polycrystalline silicon doped with impurity (i.e., doped polysilicon) may be formed on the main surface of semiconductor substrate SUB located directly under extra-pixel removal region OPR. In that case, n type region NR is formed in the main surface of semiconductor substrate SUB at the opposite ends of resistance DP made of doped polysilicon.

In the configurations of FIG. 16 to FIG. 18, transistor TR other than a transistor provided in pixel region GAR or resistance SC, DP is disposed directly under extra-pixel removal region OPR. Accordingly, if the copper contained in interconnect layers IC1-IC4 is diffused via extra-pixel removal region OPR and thus reaches directly under extra-pixel removal region OPR, an effect on degradation of dark characteristic can be suppressed to be small.

The configuration other than described above with reference to FIGS. 15-18 is substantially identical to that shown in FIG. 5, and accordingly, identical components are identically denoted and will not be described repeatedly.

The above embodiments may each be combined as appropriate.

Thus, while the invention made by the present inventor has specifically been described based on embodiments, the present invention is not limited to the embodiments and may be modified variously in a range that does not depart from its gist.

What is claimed is:

1. A method for manufacturing an image pickup device, comprising:
preparing a semiconductor substrate having a main surface and a rectangular pixel region at the main surface;
forming a plurality of photoelectric conversion devices in the pixel region of the semiconductor substrate;
forming, over the plurality of photoelectric conversion devices, an interconnect layer containing copper;
forming an insulating liner layer containing nitrogen to cover an upper surface of the interconnect layer; and
selectively removing the insulating liner layer in a region that is outside the pixel region and is located within a region that has a corner in a vertical angle relationship with one of four corners of the pixel region in a plan view, to form an extra-pixel removal region in the insulating liner layer, wherein an active region of a single conduction type surrounded by an element isolating insulating layer is formed in an entire region of the main surface of the semiconductor substrate located directly under the extra-pixel removal region.

2. The method for manufacturing an image pickup device according to claim 1, further comprising:

heating in a hydrogen containing atmosphere after forming the extra-pixel removal region in the insulating liner layer.

3. The method for manufacturing an image pickup device according to claim 2, further comprising:

forming a passivation layer over the insulating liner layer, wherein the heating in the hydrogen containing atmosphere is performed after the passivation layer is formed.

* * * * *